US008867020B2

(12) United States Patent  (10) Patent No.: US 8,867,020 B2
Smilde et al.  (45) Date of Patent: Oct. 21, 2014

(54) METROLOGY METHOD AND APPARATUS, AND DEVICE MANUFACTURING METHOD

(75) Inventors: Hendrik Jan Hidde Smilde, Veldhoven (NL); Patrick Warnaar, Tilburg (NL)

(73) Assignee: ASML Netherlands B.V., Veldhoven (NL)

( * ) Notice: Subject to any disclaimer, the term of this patent is extended or adjusted under 35 U.S.C. 154(b) by 310 days.

(21) Appl. No.: 13/235,902

(22) Filed: Sep. 19, 2011

(65) Prior Publication Data

US 2012/0242970 A1  Sep. 27, 2012

Related U.S. Application Data

(60) Provisional application No. 61/412,980, filed on Nov. 12, 2010.

(51) Int. Cl.
*G03B 27/54* (2006.01)
*G03B 27/42* (2006.01)
*G03F 7/20* (2006.01)

(52) U.S. Cl.
CPC ................... *G03F 7/70483* (2013.01)
USPC ............................... 355/67; 355/53

(58) Field of Classification Search
CPC ............ G03F 7/70483; G03F 7/70641; G03F 7/70633; G03F 7/0625
USPC ............................. 355/52, 53, 55, 67–71, 77; 356/399–401, 237.2; 700/105, 114; 250/548
See application file for complete search history.

(56) References Cited

U.S. PATENT DOCUMENTS 5,576,829 A   11/1996  Shiraishi et al.
6,762,111 B2   7/2004  Fukuda
(Continued)

FOREIGN PATENT DOCUMENTS

CN   101821678 A   9/2010
JP   2003-224057 A   8/2003
(Continued)

OTHER PUBLICATIONS

International Search Report with the Written Opinion of the International Searching Authority directed to related International Patent Application No. PCT/EP2011/066038, mailed Feb. 6, 2012, from the European Patent Office; 14 pages.

(Continued)

*Primary Examiner* — Hung Henry Nguyen
(74) *Attorney, Agent, or Firm* — Sterne, Kessler, Goldstein & Fox P.L.L.C

(57) ABSTRACT

Methods are disclosed for measuring target structures formed by a lithographic process on a substrate. A grating or other structure within the target is smaller than an illumination spot and field of view of a measurement optical system. The position of an image of the component structure varies between measurements, and a first type of correction is applied to reduce the influence on the measured intensities, caused by differences in the optical path to and from different positions. A plurality of structures may be imaged simultaneously within the field of view of the optical system, and each corrected for its respective position. The measurements may comprise first and second images of the same target under different modes of illumination and/or imaging, for example in a dark field metrology application. A second type of correction may be applied to reduce the influence of asymmetry between the first and second modes of illumination or imaging, for example to permit a more accurate overly measurement in a semiconductor device manufacturing process.

14 Claims, 6 Drawing Sheets

(56) References Cited

U.S. PATENT DOCUMENTS

| | | | |
|---|---|---|---|
| 6,961,116 | B2 | 11/2005 | Den Boef et al. |
| 7,053,390 | B2 * | 5/2006 | Shiraishi ............... 250/548 |
| 7,332,732 | B2 * | 2/2008 | Van Bilsen et al. ......... 250/548 |
| 7,433,039 | B1 | 10/2008 | Levinski et al. |
| 7,528,941 | B2 | 5/2009 | Kandel et al. |
| 7,656,518 | B2 | 2/2010 | Den Boef et al. |
| 7,791,727 | B2 | 9/2010 | Den Boef et al. |
| 7,911,612 | B2 | 3/2011 | Kiers et al. |
| 8,411,287 | B2 | 4/2013 | Smilde et al. |
| 2006/0109435 | A1 | 5/2006 | Bleeker |
| 2006/0132807 | A1 | 6/2006 | Abdulhalim et al. |
| 2006/0245092 | A1 | 11/2006 | Kuiper et al. |
| 2010/0201963 | A1 | 8/2010 | Cramer et al. |
| 2010/0231883 | A1 | 9/2010 | Dodoc et al. |
| 2011/0027704 | A1 * | 2/2011 | Cramer et al. ............ 430/30 |
| 2011/0043791 | A1 | 2/2011 | Smilde et al. |
| 2012/0044470 | A1 | 2/2012 | Smilde et al. |
| 2012/0113404 | A1 | 5/2012 | Hsu et al. |
| 2012/0123581 | A1 | 5/2012 | Smilde et al. |

FOREIGN PATENT DOCUMENTS

| | | | |
|---|---|---|---|
| JP | 2005-268237 | A | 9/2005 |
| JP | 2008-311645 | A | 12/2008 |
| JP | 2009-204621 | A | 9/2009 |
| WO | WO 2009/078708 | A1 | 6/2009 |
| WO | WO 2009/106279 | A1 | 9/2009 |
| WO | WO 2010/069757 | A1 | 6/2010 |
| WO | WO 2010/076232 | A2 | 7/2010 |
| WO | WO 2010/130600 | A1 | 11/2010 |
| WO | WO 2011/023517 | A1 | 3/2011 |

OTHER PUBLICATIONS

"Principal component analysis," Wikipedia, last modified on Nov. 28, 2011, accessed from http://en.wikipedia.org/wiki/Principal_component_analysis on Dec. 1, 2011; 14 pages.

International Search Report with the Written Opinion of the International Searching Authority directed to related International Patent Application No. PCT/EP2011/069845, mailed Feb. 7, 2012, from the European Patent Office; 11 pages.

U.S. Appl. No. 14/224,532, Smilde et al., "Metrology Method and Apparatus, and Device Manufacturing Method," filed Mar. 25, 2014.

* cited by examiner

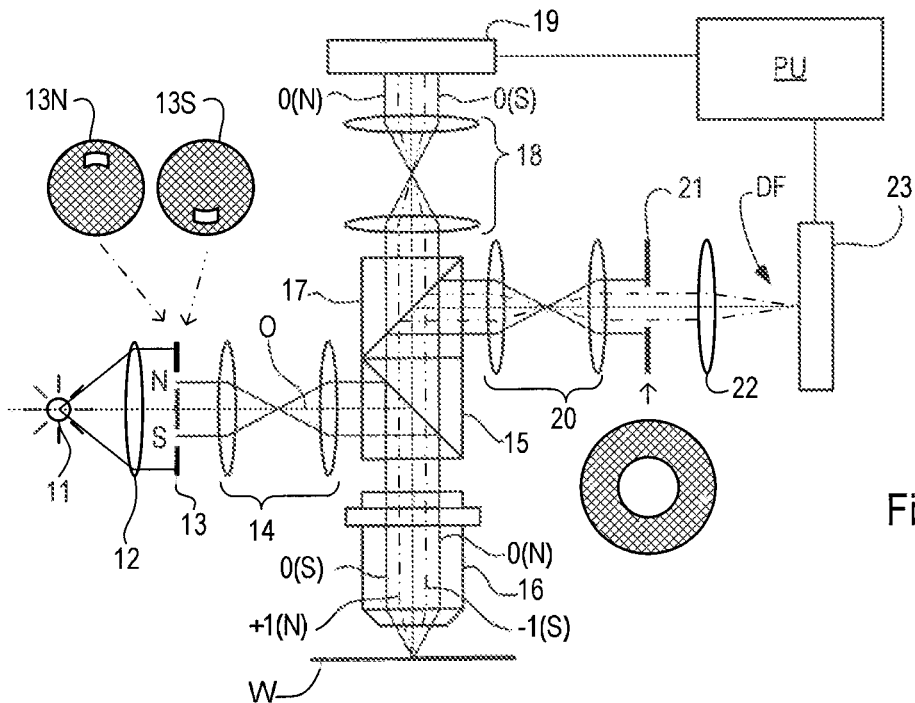
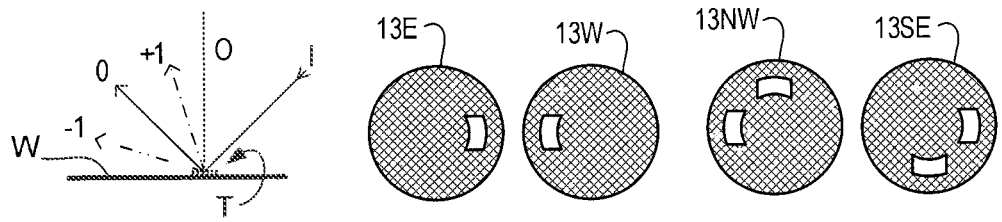
Fig. 3(a)  Fig. 3(b)  Fig. 3(c)  Fig. 3(d)
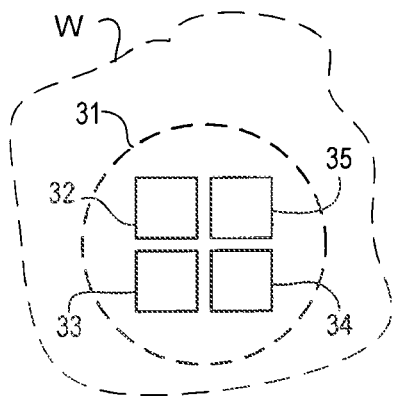
Fig. 4
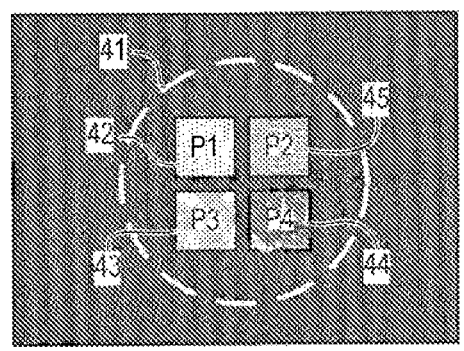
Fig. 5

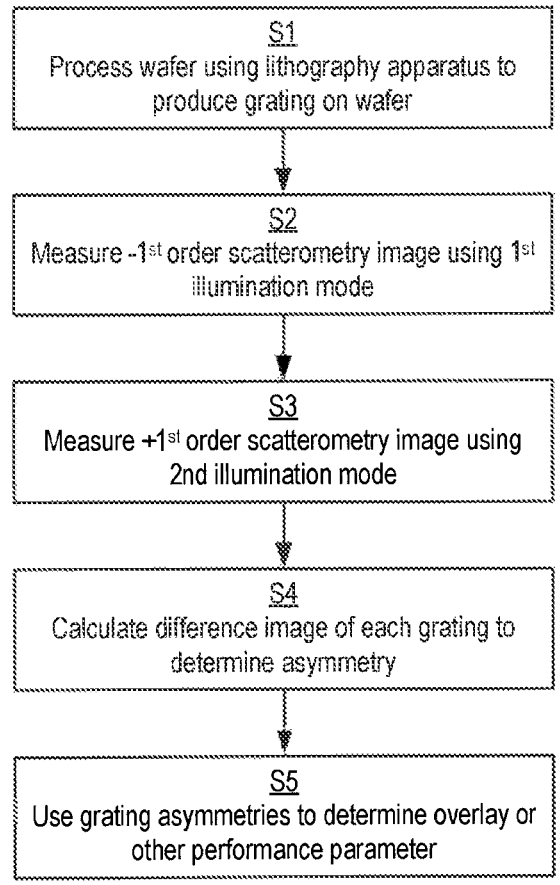
Fig. 6
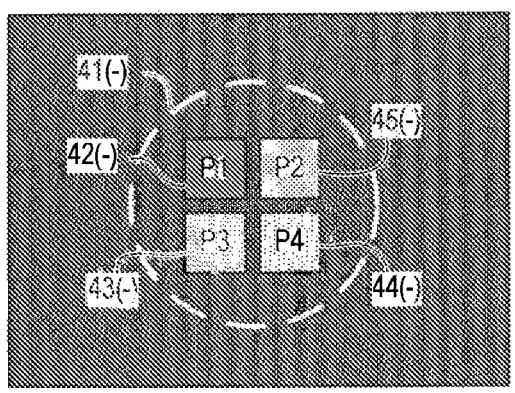 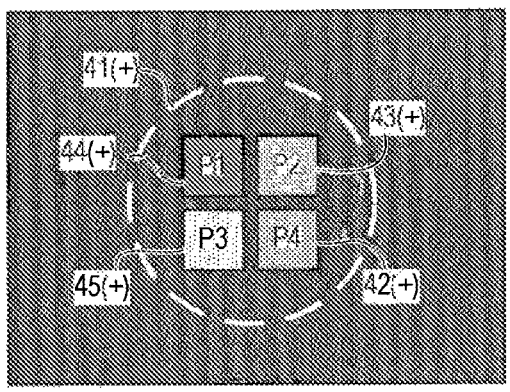
(RZ = 0)                    (RZ = π)
Fig. 7(a)                   Fig. 7(b)

(RZ = 0)  (RZ = π)

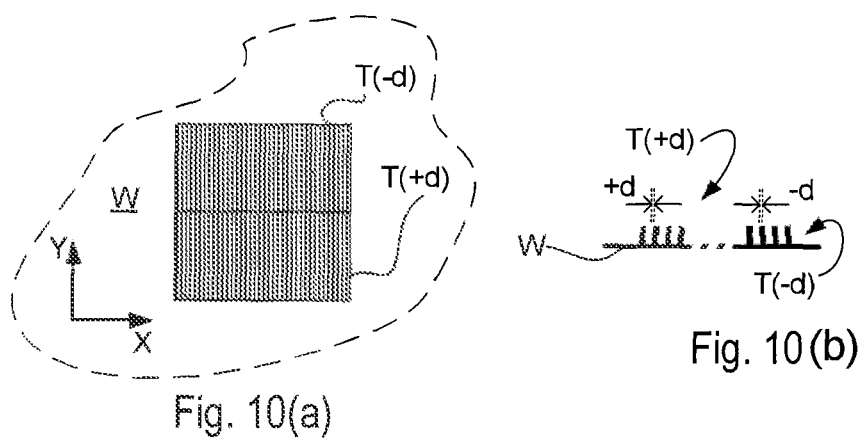
Fig. 10(a)
Fig. 10(b)
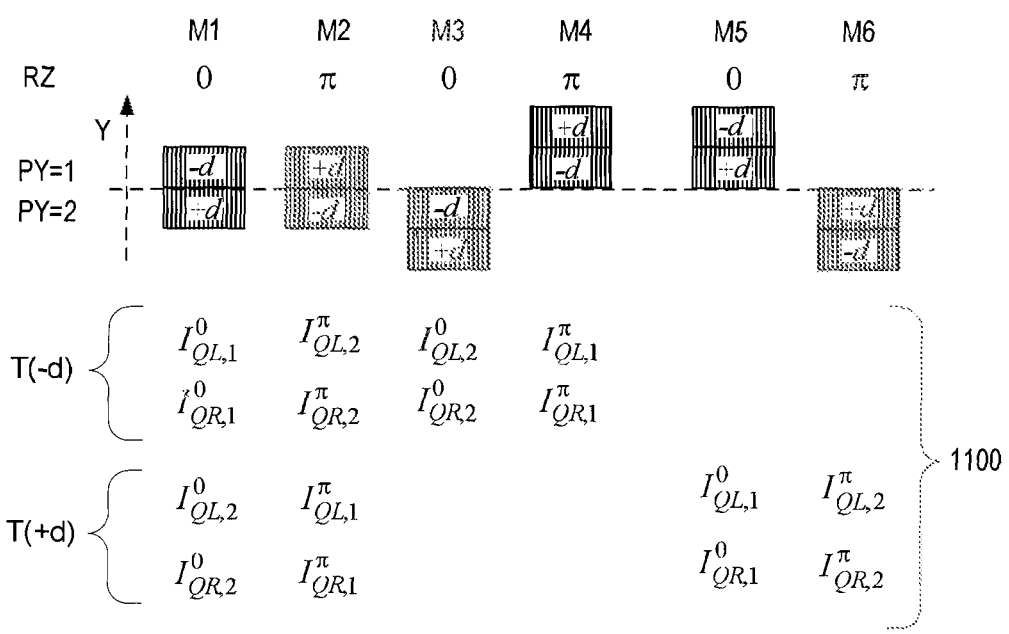
Fig. 11

METROLOGY METHOD AND APPARATUS, AND DEVICE MANUFACTURING METHOD

CROSS REFERENCE TO RELATED APPLICATIONS

This application claims benefit under 35 U.S.C. 119(e) to U.S. Provisional Application No. 61/412,980, filed Nov. 12, 2010, which is incorporated by reference herein in its entirety.

BACKGROUND

1. Field of Embodiments of the Present Invention

The present invention relates to methods and apparatus for metrology usable, for example, in the manufacture of devices by lithographic techniques and to methods of manufacturing devices using lithographic techniques.

2. Background Art

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., including part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the patter through a radiation beam in a given direction (the "scanning"-direction) while synchronously scanning the substrate parallel or anti parallel to this direction. It is also possible to transfer the pattern from the patterning device to the substrate by imprinting the pattern onto the substrate.

In lithographic processes, it is desirable frequently to make measurements of the structures created, e.g., for process control and verification. Various tools for making such measurements are known, including scanning electron microscopes, which are often used to measure critical dimension (CD), and specialized tools to measure overlay, the accuracy of alignment of two layers in a device. Recently, various forms of scatterometers have been developed for use in the lithographic field. These devices direct a beam of radiation onto a target and measure one or more properties of the scattered radiation—e.g., intensity at a single angle of reflection as a function of wavelength; intensity at one or more wavelengths as a function of reflected angle; or polarization as a function of reflected angle—to obtain a "spectrum" from which a property of interest of the target can be determined. Determination of the property of interest may be performed by various techniques: e.g., reconstruction of the target structure by iterative approaches such as rigorous coupled wave analysis or finite element methods; library searches; and principal component analysis.

The targets used by conventional scatterometers are relatively large, e.g., 40 µm by 40 µm, gratings and the measurement beam generates a spot that is smaller than the grating (i.e., the grating is underfilled). This simplifies mathematical reconstruction of the target as it can be regarded as infinite. However, in order to reduce the size of the targets, e.g., to 10 µm by 10 µm or less, e.g., so they can be positioned in amongst product features, rather than in the scribe lane, so-called "small target" metrology has been proposed, in which the grating is made smaller than the measurement spot (i.e., the grating is overfilled). Typically small targets are measured using dark field scatterometry in which the zeroth order of diffraction (corresponding to a specular reflection) is blocked, and only higher orders processed. Diffraction-based overlay using dark-field detection of the diffraction orders enables overlay measurements on smaller targets. These targets can be smaller than the illumination spot and may be surrounded by product structures on a wafer. The intensities from the environment product structures can efficiently be separated from the intensities from the overlay target with the dark-field detection in the image-plane.

In the known dark-field metrology technique, best overlay measurement results are obtained if the target is measured twice under certain conditions, while the wafer is rotated to obtain both the $-1^{st}$ and the $+1^{st}$ diffraction order intensities. The use of exactly the same optical path for both measurements ensures that the different between them is due to target properties, not properties of the instrument. On the other haul, the requirement to rotate the target, which may be on a large substrate, makes the process slow and the apparatus potentially more complex. Also, if the target after rotation is not positioned exactly where it was measured before, it cannot be assumed that the optical system will perform exactly the same in both measurements. Accurate positioning requires more costly equipment and/or costs time in the measurement process. The problem of accurate positioning may arise in other types of metrology instruments and methods, besides the dark field method using scatterometers. For example the same problem may arise where intensity measurements are made using zero order radiation reflected from targets smaller than the illumination spot.

SUMMARY

It is desirable to provide a method and apparatus for dark field metrology, for example to measure asymmetry and/or overlay in target gratings, in which throughput and accuracy can be improved over prior published techniques.

A first embodiment of the present invention provides a method of measuring asymmetry in a periodic structure formed by a lithographic process on a substrate, the method comprising the steps of: using the lithographic process to form a periodic structure on the substrate, a first measurement step comprising forming and detecting a first image of the periodic structure while illuminating the structure with a first beam of radiation, the first image being formed using a first part of non-zero order diffracted radiation while excluding zero order diffracted radiation, a second measurement step comprising forming and detecting a second image of the periodic structure while illuminating the structure with a second beam of radiation, the second image being formed using a second part of the non-zero order diffracted radiation which is symmetrically opposite to the first part, in a diffraction spectrum of the periodic structure, and using a difference in intensity values derived from the detected first and second images together to determine the asymmetry in the profile of the periodic structure. The first and second measurement steps are performed using different optical paths within a measurement optical system. The method further comprises at least one correction step, applied either to the first and second image intensity values or to the calculated difference between them, for reducing an influence on the determined asymmetry of the difference in optical paths between the first and second measurement steps.

The correction may be effective to reduce the influence of one or more of the following: a change in illumination mode between the first and second measurement steps, a change in imaging mode between the first and second measurement steps, and the position of the periodic structure within an image field of the optical system in each of the first and second measurement steps.

Embodiments of the present invention may be used in small target, dark field overlay metrology. The determined asymmetry may be used as a measure of overlay in a multi-layered grating target, so that feedback can be applied to a lithographic process to reduce overlay error in subsequent patterning operations.

A second embodiment of the present invention further provides an inspection apparatus configured for measuring asymmetry in a periodic structure on a substrate, the inspection apparatus comprising: an illumination arrangement operable to deliver first and second beams of radiation to the substrate for use in first and second measurement steps, a detection arrangement operable during the first and second measurement steps to form and detect respective first and second images of the substrate using radiation diffracted from the substrate, and a stop arrangement within the detection arrangement. The illumination arrangement and stop arrangement together are effective to stop zero order diffracted radiation contributing to the first and second images, and are configurable to form first and second images using first and second parts respectively of the non-zero order diffracted radiation, the first and second parts being symmetrically opposite one another in a diffraction spectrum of the diffracted radiation, wherein the inspection apparatus further comprises a computational arrangement operable to determine the asymmetry using a difference in intensity values derived from the first and second images, and wherein the computational arrangement is operable when calculating the difference to apply a correction for reducing an influence on the determined asymmetry of a difference between first and second optical paths, that are used within the inspection apparatus for the first and second measurement steps respectively.

A third embodiment of the present invention provides a method of measuring properties of a target structure formed by a lithographic process on a substrate, the method comprising the steps of: using the lithographic process to form a structure on the substrate, forming and detecting an image of the structure through an optical system while illuminating the structure with a beam of radiation, and using intensity values derived from the detected image together to determine at least one parameter of the structure. The image of the structure is smaller than an image field of the optical system. The method further comprises detecting a position of the image within the image field and applying a correction to reduce an influence on the measured properties of a difference in optical paths between positions.

Embodiments of the present invention may be applied in small-target metrology more broadly than dark field metrology.

Another embodiments of the present invention provides an inspection apparatus for measuring properties of a target structure formed by a lithographic process on a substrate, the inspection apparatus comprising: an illumination arrangement operable to deliver a radiation beam to the substrate, a detection arrangement operable to form and detect an image of the structure through an optical system while the illumination arrangement is illuminating the structure with a radiation beam, a computational arrangement operable: to use intensity values derived from the detected image together to determine at least one property of the structure, to detect a position of the image within the image field when the image of the structure is smaller than an image field of the optical system, in response to detected position, to apply a correction to reduce an influence on the measured property of differences in optical paths associated with different image positions.

A still further embodiment of the present invention provides a lithographic system including a lithographic apparatus and an inspection apparatus according to the first and/or second aspect of Embodiments of the present invention, as set forth above.

An even further embodiment of the present invention provides a method of manufacturing devices wherein a device pattern is applied to a series of substrates using a lithographic process, the method including inspecting at least one periodic structure formed as part of or beside the device pattern on at least one of the substrates using an inspection method according to the embodiments of the present invention as set forth above, and controlling the lithographic process for later substrates in accordance with the result of the inspection method.

Further features and advantages of embodiments of the present invention, as well as the structure and operation of various embodiments of embodiments of the present invention, are described in detail below with reference to the accompanying drawings. It is noted that embodiments of the present invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS/FIGURES

The accompanying drawings, which are incorporated herein and form part of the specification, illustrate the present invention and, together with the description, further serve to explain the principles of embodiments of the present invention and to enable a person skilled in the relevant art(s) to make and use Embodiments of the present invention.

FIG. 3 comprises (a) a schematic diagram of a dark field scatterometer for use in measuring targets according to embodiments of Embodiments of the present invention using a first pair of illumination apertures, (b) a detail of diffraction spectrum of a target grating for a given direction of illumination (c) a second pair of illumination apertures providing further illumination modes in using the scatterometer for diffraction based overlay measurements and (d) a third pair of illumination apertures combining the first and second pair of apertures.

FIG. 4 depicts a known form of target and an outline of a measurement spot on a substrate.

FIG. 5 depicts an image of the targets of FIG. 4 obtained in the scatterometer of FIG. 3.

FIG. 6 is a flowchart showing the steps of an overlay measurement using the scatterometer of FIG. 3.

FIG. 7 depicts (a) first and (b) second images of the targets obtained using first and second illumination modes in the process of FIG. 6.

FIG. 8 depicts (a) first and (b) second images of the targets obtained using first and second illumination modes in the process of FIG. 6, where positioning of the targets in an image field is subject to variation.

Figure 9:
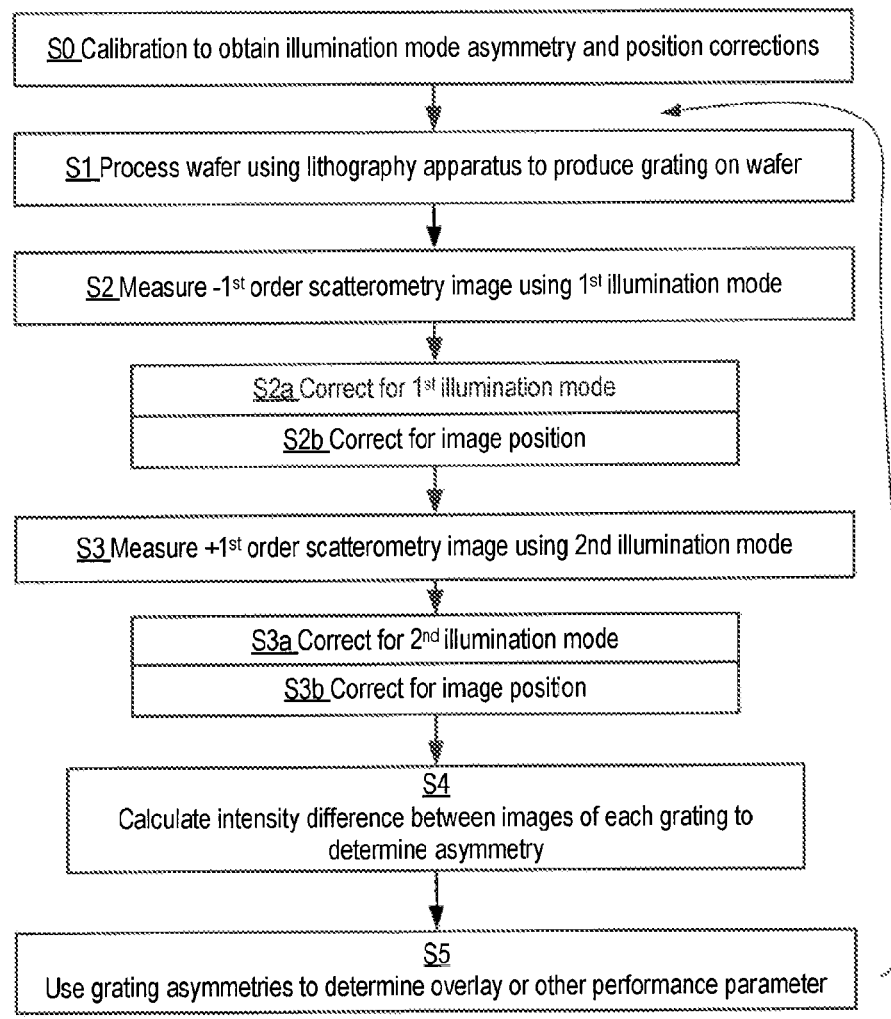

FIG. 9 is a flowchart showing the steps of an overlay measurement process incorporating correction steps in accordance with the present invention.

FIG. 10 illustrates an alternative form of target in (a) plan view and (b) schematic cross-section.

FIG. 11 illustrates a set of measurements made using the target of FIG. 10 in a calibration step of a first implementation of the present invention.

Figure 12:
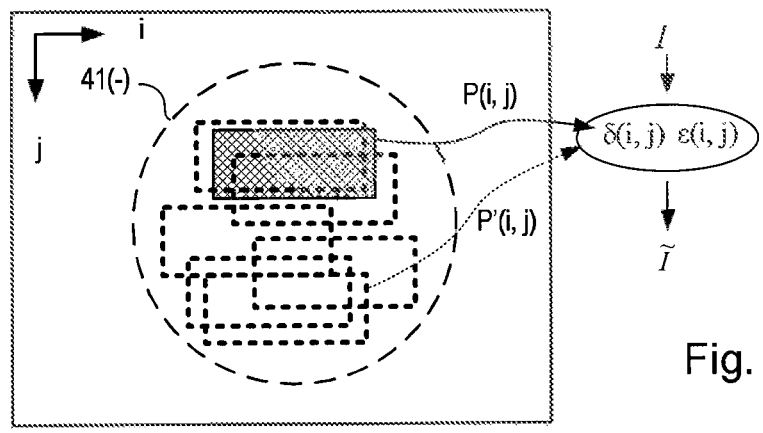

FIG. 12 illustrates a calibration and correction process in a second implementation of an embodiment of the present invention.

Figure 13:
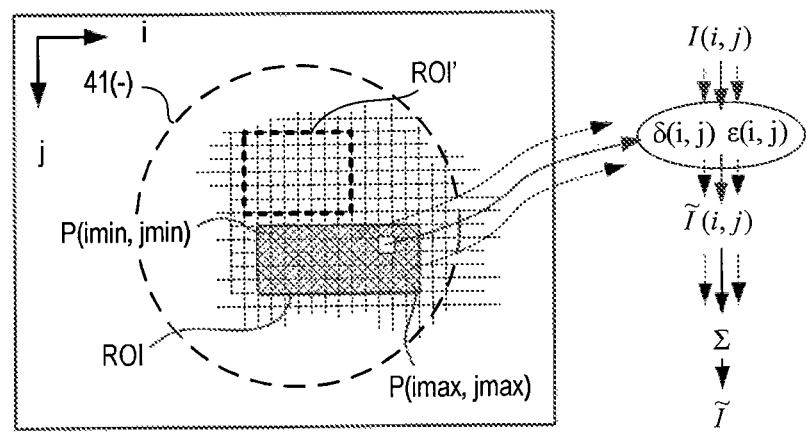

FIG. 13 illustrates a calibration and correction process in a third implementation of embodiments of the present invention.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements. The drawing in which an element first appears is indicated by the leftmost digit(s) in the corresponding reference number.

DETAILED DESCRIPTION

This specification discloses one or more embodiments that incorporate the features of this invention. The disclosed embodiment(s) merely exemplify Embodiments of the present invention. The scope of embodiments of the present invention is not limited to the disclosed embodiment(s). Embodiments of the present invention are defined by the claims appended hereto.

The embodiment(s) described, and references in the specification to "one embodiment", "an embodiment", "an example embodiment", etc, indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or character characteristic in connection with other embodiments whether or not explicitly described.

Embodiments of the present invention may be implemented in hardware, firmware, software, or any combination thereof. Embodiments of the present invention may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc.

Before describing embodiments of the present invention in detail, it is instructive to present an example environment in which embodiments of the present invention may be implemented.

Figure 1:
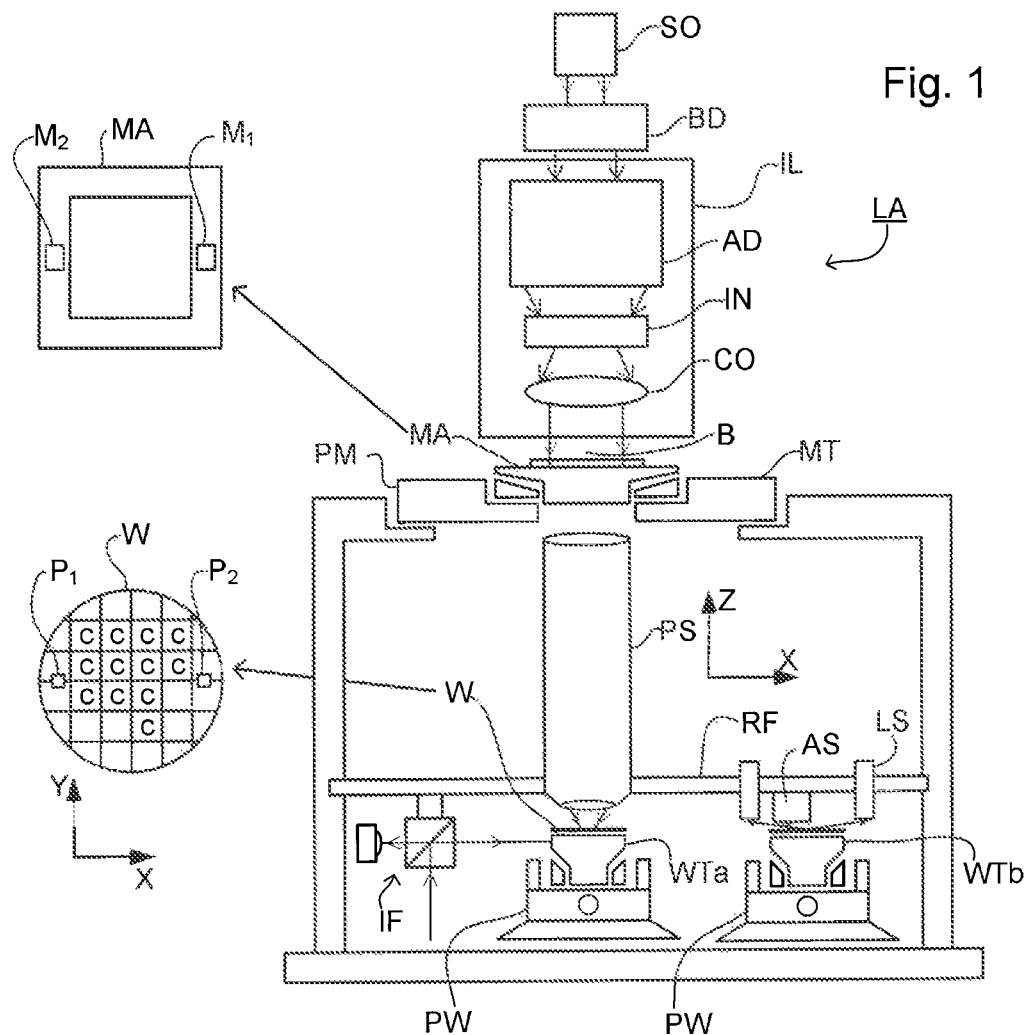
FIG. 1 depicts a lithographic apparatus according to an embodiment of the present invention.

FIG. 1 schematically depicts a lithographic apparatus LA. The apparatus includes an illumination system (illuminator) IL configured to condition a radiation beam B (e.g., UV radiation or DUV radiation), a patterning device support or support structure (e.g., a mask table) MT constructed to support a patterning device (e.g., a mask) MA and connected to a first positioner PM configured to accurately position the patterning device in accordance with certain parameters; a substrate table (e.g., a wafer table) WT constructed to hold a substrate (e.g., a resist coated wafer) W and connected to a second positioner PW configured to accurately position the substrate in accordance with certain parameters; and a projection system (e.g., a refractive projection lens system) PS configured to project a pattern imparted to the radiation beam B by patterning device MA onto a target portion C (e.g., including one or more dies) of the substrate W.

The illumination system may include various types of optical components, such as refractive, reflective, magnetic, electromagnetic, electrostatic or other types of optical components, or any combination thereof, for directing, shaping, or controlling radiation.

The patterning device support holds the patterning device in a manner that depends on the orientation of the patterning device, the design of the lithographic apparatus, and other conditions, such as for example whether or not the patterning device is held in a vacuum environment. The patterning device support can use mechanical, vacuum, electrostatic or other clamping techniques to hold the patterning device. The patterning device support may be a frame or a table, for example, which may be fixed or movable as required. The patterning device support may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam, which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g., employing a transmissive mask). Alternatively, the apparatus may be of a reflective type (e.g., employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross section.

The radiation beam B is incident on the patterning device (e.g., mask) MA, which is held on the patterning device support (e.g., mask table MT), and is patterned by the patterning device. Having traversed the patterning device (e.g., mask) MA, the radiation beam B passes through the projection system PS, which focuses the beam onto a target portion C of the substrate W. With the aid of the second positioner PW and position sensor IF (e.g., an interferometric device, linear encoder, 2-D encoder or capacitive sensor), the substrate table WT can be moved accurately, e.g., so as to position different target portions C in the path of the radiation beam B. Similarly, the first positioner PM and another position sensor (which is not explicitly depicted in FIG. 1) can be used to accurately position the patterning device (e.g., mask) MA with respect to the path of the radiation beam B, e.g., after mechanical retrieval from a mask library, or during a scan. In general, movement of the patterning device support (e.g., mask table) MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the patterning device support (e.g., mask table) MT may be connected to a short-stroke actuator only, or may be fixed.

Patterning device (e.g., mask) MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device (e.g., mask) MA, the mask alignment marks may be located between the dies. Small alignment markers may also be included within dies, in amongst the device features, in which case it is desirable that the markers be as small as possible and not require any different imaging or process conditions than adjacent features. The alignment system, which detects the alignment markers is described further below.

The depicted apparatus could be used in at least one of the following modes:
1. In step mode, the patterning device support (e.g., mask table) MT and the substrate table WT are kept essentially stationary, while an entire pattern imparted to the radiation beam is projected onto a target portion C at one time (i.e., a single static exposure). The substrate table WT is then shifted in the X and/or Y direction so that a different target portion C can be exposed. In step mode, the maximum size of the exposure field limits the size of the target portion C imaged in a single static exposure.
2. In scan mode, the patterning device support (e.g., mask table) MT and the substrate table WT are scanned synchronously while a pattern imparted to the radiation beam is projected onto a target portion C (i.e., a single dynamic exposure). The velocity and direction of the substrate table WT relative to the patterning device support (e.g., mask table) MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.
3. In another mode, the patterning device support (e.g., mask table) MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Lithographic apparatus LA is of a so-called dual stage type which has two substrate tables WTa, WTb and two stations—an exposure station and a measurement station—between which the substrate tables can be exchanged. While one substrate on one substrate table is being exposed at the exposure station, another substrate can be loaded onto the other substrate table at the measurement station and various preparatory steps carried out. The preparatory steps may include mapping the surface control of the substrate using a level sensor LS and measuring the position of alignment markers on the substrate using an alignment sensor AS. This enables a substantial increase in the throughput of the apparatus. If the position sensor IF is not capable of measuring the position of the substrate table while it is at the measurement station as well as at the exposure station, a second position sensor may be provided to enable the positions of the substrate table to be tracked at both stations.

Figure 2:
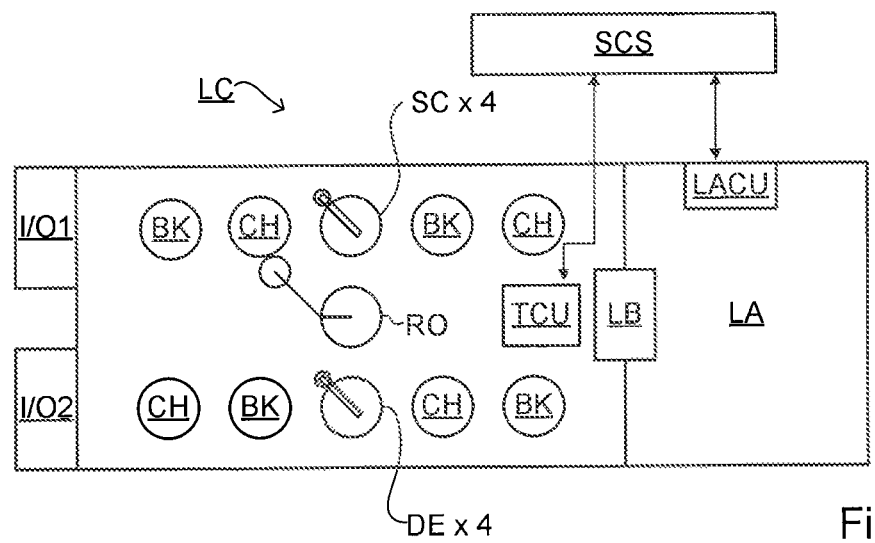
FIG. 2 depicts a lithographic cell or cluster according to an embodiment of the present invention.

As shown in FIG. 2, the lithographic apparatus LA forms part of a lithographic cell LC, also sometimes referred to a lithocell or cluster, which also includes apparatus to perform pre- and post-exposure processes on a substrate. Conventionally these include spin coaters SC to deposit resist layers, developers DE to develop exposed resist, chill plates CH and bake plates BK. A substrate handler, or robot, RO picks up substrates from input/output ports I/O1, I/O2, moves them between the different process apparatus and delivers then to the loading bay LB of the lithographic apparatus. These devices, which are often collectively referred to as the track, are under the control of a track control unit TCU which is itself controlled by the supervisory control system SCS, which also controls the lithographic apparatus via lithography control unit LACU. Thus, the different apparatus can be operated to maximize throughput and processing efficiency.

Examples of dark field metrology can be found in international patent applications WO 2009/078708 and WO 2009/106279, which documents are hereby incorporated by reference in their entirety.

A dark field metrology apparatus according to an embodiment of the present invention is shown in FIG. 3(a). A target grating T and diffracted rays are illustrated in more detail in FIG. 3(b). The dark field metrology apparatus may be a stand-alone device or incorporated in either the lithographic apparatus LA, e.g., at the measurement station, or the lithographic cell LC. An optical axis, which has several branches throughout the apparatus, is represented by a dotted line O. In this apparatus, light emitted by source 11 (e.g., a xenon lamp) is directed onto substrate W via a beam splitter 15 by an optical system comprising lenses 12, 14 and objective lens 16. These lenses are arranged in a double sequence of a 4F arrangement. Therefore, the angular range at which the radiation is incident on the substrate can be selected by defining a spatial intensity distribution in a plane that presents the spatial spectrum of the substrate plane, here referred to as a (conjugate) pupil plane. In particular, this can be done by inserting an aperture plate 13 of suitable form between lenses 12 and 14, in a plane which is a back-projected image of the objective lens pupil plane. In the example illustrated, aperture plate 13 has different forms, labeled 13N and 13S, allowing different illumination modes to be selected. The illumination system in the present examples forms an off-axis illumination mode. In the first illumination mode, aperture plate 13N provides off-axis from a direction designated, for the sake of description only, as 'north'. In a second illumination mode, aperture plate 13S is used to provide similar illumination, but from an opposite direction, labeled 'south'. Other modes of illumination are possible by using different apertures. The rest of the pupil plane is desirably dark as any unnecessary light outside the desired illumination mode will interfere with the desired measurement signals.

As shown in FIG. 3(b), target grating T is placed with substrate W normal to the optical axis O of objective lens 16. A ray of illumination I impinging on grating T from an angle off the axis O gives rise to a zeroth order ray (solid line 0) and two first order rays (dot-chain line +1 and double dot-chain line −1). It should be remembered that with an overfilled small target grating, these rays are just one of many parallel rays covering the area of the substrate including metrology target grating T and other features. Since the aperture in plate 13 has a finite width (necessary to admit a useful quantity of light, the incident rays I will in fact occupy a range of angles, and the diffracted rays 0 and +1/−1 will be spread out somewhat. According to the point spread function of a small target, each order +1 and −1 will be further spread over a range of angles, not a single ideal ray as shown. Note that the grating pitches and illumination angles can be designed or adjusted so that the first order rays entering the objective lens are closely aligned with the central optical axis. The rays illustrated in FIGS. 3(a) and 3(b) are shown somewhat off axis, purely to enable them to be more easily distinguished in the diagram.

At least the 0 and +1 orders diffracted by the target on substrate W are collected by objective lens 16 and directed back through beam splitter 15. Returning to FIG. 3(a), both the first and second illumination modes are illustrated, by designating diametrically opposite apertures labeled as north (N) and south (S). When the incident ray I is from the north side of the optical axis, that is when the first illumination mode is applied using aperture plate 13N, the +1 diffracted rays, which are labeled +1(N), enter the objective lens 16. In contrast, when the second illumination mode is applied using aperture plate 13S to −1 diffracted rays (labeled −1(S) are the ones which enter the lens 16.

A second beam splitter 17 divides the diffracted beams into two measurement branches. In a first measurement branch, optical system 18 forms a diffraction spectrum (pupil plane image) of the target on first sensor 19 (e.g., a CCD or CMOS sensor) using the zeroth and first order diffractive beams. Each diffraction order hits a different point on the sensor, so that image processing can compare and contrast orders. The pupil plane image captured by sensor 19 can be used for focusing the metrology apparatus and/or normalizing intensity measurements of the first order beam. The pupil plane image can also be used for many measurement purposes such as reconstruction, which are not the subject of the present disclosure.

In the second measurement branch, optical system 20, 22 forms an image of the target on the substrate W on sensor 23 (e.g., a CCD or CMOS sensor). In the second measurement branch, an aperture stop 21 is provided in a plane that is conjugate to the pupil-plane. Aperture stop 21 functions to block the zeroth order diffracted beam so that the image of the target formed on sensor 23 is formed only from the −1 or +1 first order beam. The images captured by sensors 19 and 23 are output to image processor and controller PU, the function of which will depend on the particular type of measurements being performed. Note that the term 'image' is used here in a broad sense. An image of the grating lines as such will not be formed, if only one of the −1 and +1 orders is present.

The particular forms of aperture plate 13 and field stop 21 shown in FIG. 3 are purely examples. In another embodiment of the present invention, on-axis illumination of the targets is used and an aperture stop with an off-axis aperture is used to pass substantially only one first order of diffracted light to the sensor. In yet other embodiments, 2nd, 3rd and higher order beams (not shown in FIG. 3) can be used in measurements, instead of or in addition to the first order beams.

In order to make the illumination adaptable to these different types of measurement, the aperture plate 13 may comprise a number of aperture patterns formed around a disc, which rotates to bring a desired pattern into place. Alternatively or in addition, a set of plates 13 could be provided and swapped, to achieve the same effect. A programmable illumination device such as a deformable mirror array or transmissive spatial sight modulator can be used also. Moving mirrors or prisms can be used as another way to adjust the illumination mode.

As just explained in relation to aperture plate 13, the selection of diffraction orders for imaging can alternatively be achieved by altering the field stop 21, or by substituting a field stop having a different pattern, or by replacing the fixed field stop with a programmable spatial light modulator. In that case the illumination side of the measurement optical system can remain constant, while it is the imaging side that has first and second modes. In the present disclosure, therefore, there are effectively two types of embodiment: one where the illumination mode is changed and another where the imaging mode is changed. In each case the desired effect is the same, namely to select first and second portions of the non-zero order diffracted radiation which are symmetrically opposite one another in the diffraction spectrum of the target. For the most part, this description will describe embodiments of the first type, in which illumination modes are changed. Where it is desired to make a distinction between the two types of embodiment, this will be made clear by reference to "illumination modes" and "imaging modes". Where no distinction is made, the reader should understand that the treatment of different illumination modes in the illustrated embodiment can be adapted readily to the imaging modes in the other type of embodiment. In principle, the desired selection of orders could be obtained by a combination of changing the illumination modes and the imaging modes simultaneously, but that is likely to bring disadvantages for no advantage, so it will not be discussed further.

While the optical system used for imaging in the present examples has a wide entrance pupil which is restricted by the field stop 21, in other embodiments or applications the entrance pupil size of the imaging system itself may be small enough to restrict to the desired order, and thus serve also as the field stop. Different aperture plates are shown in FIGS. 3(c) and (d) which can be used as described further below. For the time being, it is sufficient to consider simply that the aperture plate 13N is used.

FIG. 4 depicts a composite target formed on a substrate according to known practice. The composite target comprises four gratings 32 to 35 positioned closely together so that they will all be within a measurement spot 31 formed by the illumination beam of the metrology apparatus and thus are all simultaneously illuminated and simultaneously imaged on sensors 19 and 23. In an example dedicated to overlay measurement, gratings 32 to 35 are themselves composite gratings formed by overlying gratings that are patterned in different layers of the semi-conductor device formed on substrate W. Gratings 32 to 35 are differently biased in order to facilitate measurement of overlay between the layers in which the different parts of the composite gratings are formed. In one example, gratings 32 to 35 have biases of +d, −d, +3d, −3d respectively. This means that one of the gratings has its components arranged so that if they were both printed exactly at their nominal locations one of the components would be offset relative to the other by a distance d. A second grating has its components arranged so that if perfectly printed there would be an offset of d but in the opposite direction to the first grating and so on. While four gratings are illustrated, a practical embodiment might require a larger matrix to obtain the desired accuracy. For example, a 3×3 array of nine composite gratings may have biases −4d, −3d, −2d, −d, 0, +d, +2d, +3d, +4d. Separate images of these gratings can be identified in the image captured by sensor 23.

FIG. 5 shows an example of an image that may be formed on and detected by the sensor 23, using the target of FIG. 4 in the apparatus of FIG. 3, using the aperture plates 13N or 13S from FIG. 3(a). While the pupil plane image sensor 19 cannot resolve the different individual gratings 32 to 35, the image sensor 23 can do so. The dark rectangle represents the field of the image on the sensor, within which the illuminated spot 31 on the substrate is imaged into a corresponding circular area 41. Within this, rectangular areas 42-45 represent the images of the small target gratings 32 to 35. If the gratings are located in product areas, product features may also be visible in this image. Image processor and controller PU processes these images to identify the separate images 42 to 45 of gratings 32 to 35. This can be done by pattern matching techniques, so that the images do not have to be aligned very precisely at a specific location within the sensor frame. Reducing the need for accurate alignment in this way greatly improves throughput of the measuring apparatus as a whole. However the need for accurate alignment remains if the imaging process is subject to non-uniformities across the image field. In one embodiments of the present invention, four positions P1 to P4 are identified and the gratings are aligned as much as possible with these known positions.

Once the separate images of the gratings have been identified, the intensities of those individual images can be measured, e.g., by averaging or summing selected pixel intensity values within the identified areas Intensities and/or other properties of the images can be compared with one another. These results can be combined to measure different parameters of the lithographic process. Overlay performance is an important example of such a parameter.

FIGS. 6 and 7 illustrate how, using for example the method described in application PCT/EP2010/060894, which is incorporated by reference herein in its entirety, overlay error between the two layers containing the component gratings 32 to 35 is measured through asymmetry of the gratings, as revealed by comparing their intensities in the +1 order and −1 order dark field images. At step S1, the substrate, for example a semiconductor wafer, is processed through the lithographic cell of FIG. 2 one or more times, to create a structure including the overlay targets 32-35. At S2, using the metrology apparatus of FIG. 3 with only a single pole of illumination (e.g., north, using plate 13N), an image of the gratings 32 to 35 is obtained using only one of the first order diffracted beams (say −1). Then, according to the prior application, substrate W is rotated by 180° and the gratings repositioned in the field of view of the metrology apparatus so that a second image of the gratings using the other first order diffracted beam can be obtained (step S3). Consequently the +1 diffracted radiation is captured in the second image.

FIG. 7 shows the two images (a) and (b) obtained in steps S2 and S3 respectively. The 180° rotation is indicated by the legends RZ=0 and RZ=π, referring to rotation about the Z axis, normal to the substrate surface. The image in FIG. 7(a) looks like that shown in FIG. 5, where the area of the illumination spot 31 is imaged using just the −1 order diffracted radiation into circle 41(−) and the individual grating images are labeled 42(−) to 45(−). FIG. 7(b) looks similar but with the grating images 42(+) to 45(+) begin made using only the +1 order radiation, their intensities are different. Also, the 180° rotation has placed each grating image at a different one of the positions P1-P4. Note that, by including only half of the first order diffracted radiation in each image, the 'images' referred to here are not conventional dark field microscopy images. The individual grating lines will not be resolved. Each grating will be represented simply by an area of a certain grey level. The asymmetry of the grating structure, and hence overlay error, can then be determined by the image processor and controller PU by (S4) comparing the intensity values obtained for +1 and −1 orders for each grating 32-35 to identify any difference in their intensity, and (S5) from knowledge of the overlay biases of the gratings to determine overlay error in the vicinity of the target T.

Typically, a target grating will be aligned with its grating lines running either north-south or east-west. That is to say, a grating will be aligned in the X direction or the Y direction of the substrate W. Note that aperture plate 13N or 13S can only be used to measure gratings oriented in one direction (X or Y depending on the set-up). For measurement of an orthogonal grating, rotation through 90° and 270° might be implemented. More conveniently, however, illumination from east or west is provided in the illumination optics, using the aperture plate 13E or 13W, shown in FIG. 3(c). The aperture plates 13N to 13W can be separately formed and interchanged, or they may be a single aperture plate which can be rotated by 90, 180 or 270 degrees. As mentioned already, the off-axis apertures illustrated in FIG. 3(c) could be provided in field stop 21 instead of in illumination aperture plate 13. In that case, the illumination would be on axis.

FIG. 3(d) shows a third pair of aperture plates that can be used to combine the illumination modes of the first and second pairs. Aperture plate 13NW has apertures at north and east, while aperture plate 13 SE has apertures at south and west. One of these gratings will diffract light from the east and west portions of the aperture plates, while the other grating will diffract light from the north and south portions. Provided that cross-talk between these different diffraction signals is not too great, measurements of both X and Y gratings can be performed without changing the illumination mode.

Because, in the example process just described, the target rotates by 180° while the optical system in principle remains constant, any differences in intensity between the images made using −1 and +1 order should be attributable entirely to asymmetry, and hence overlay error, in the target gratings. However, in practice, a number of issues arise which make the intensity difference somewhat dependent on the measuring apparatus, and hence make the overlay or other measurement result less accurate.

One of these issues is position-dependence of the measurements. In order to ensure that the optical system performance is constant between the measurements in steps S2 and S3, the individual gratings should be positioned at exactly the same point in the illumination spot, and at the same position in the sensor image field. Otherwise, there is the possibility that differences between the measurements are due to inhomogeneous illumination across the illumination spot, and/or variation in response of sensor 23 across the image field. Therefore measuring, for example, grating 32 at position P1 in step S2 and position P4 in step S3 means that the difference between grating images 44(−) and 44(+) potentially includes position-dependent effects. Of course, it would be an option to place each individual grating at a common, central position in the image field. However, part of the incentive to use such small targets is to allow several gratings to be imaged in one measurement, and the throughput penalty would be severe.

Another issue is that the requirement to rotate the substrate through 180°. This complicates the apparatus. The rotation step between measurements introduces delays which can reduce the throughput of the process and increases the risk that measurement conditions between the two images will be non-identical.

To avoid the need for the substrate to be rotated, the illumination mode can be changed in the apparatus, while the substrate stays still. For this purpose, switching the aperture plates in their pairs 13N/13S or 13E/13W or 13NW/13SE allows the 180° to be simulated rather than real. For example, in the measurement steps S2 and S3, the aperture plates 13S to 13N respectively may be used, while keeping the optical system otherwise the same. Consequently the −1(S) diffracted radiation is captured in the first image and the +1(N) radiation is captured in the second image. As mentioned above, the change of illumination mode can be implemented in other ways, for example using deformable mirror devices in place of exchangeable aperture plates. The present description includes all these alternatives as possibilities, but for simplicity the swapping of aperture plates will be used as the representative implementation.

Where a number of targets are to be measured across the substrate, there are various possibilities for sequencing the measurement to achieve the maximum throughput and accuracy with a given hardware set-up. For example, measurement steps S2 and S3 can be performed each target, swapping the illumination mode, before moving to the next target. To minimize the swapping operations, the steps may be performed in the order S2, S3 for one target, and in the order S3, S2 for the next. Alternatively, the step S2 may be performed for all targets on the substrate, or for a certain group of targets, before swapping the illumination mode and performing step S3 for all the targets. The images can be stored in unit PU, or external storage. Provided they are indexed or labeled with their corresponding target ID and illumination mode, the order in which they are obtained is unimportant for their subsequent processing.

Figures 8A, 8B:
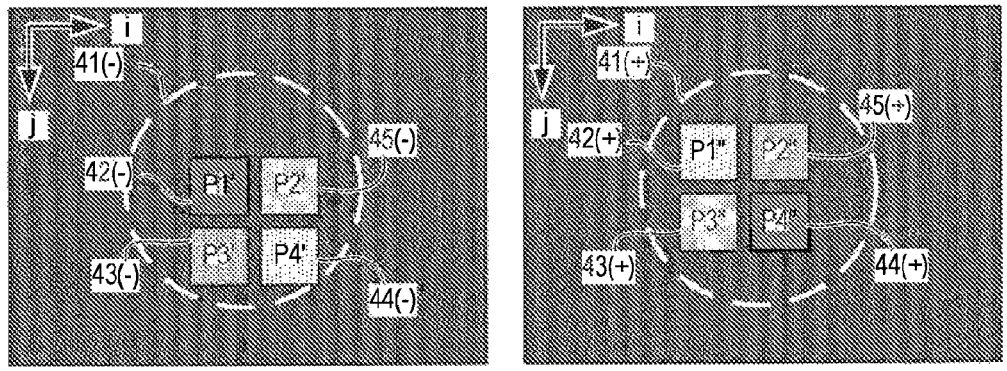

FIG. 8 shows the two images (a) and (b) obtained in steps S2 and S3 respectively. The 180° rotation is still indicated by the legends RZ=0 and RZ=π, but bearing in mind that the rotation is by changing an aperture position within the instrument, instead of rotating the substrate. As would be expected, the sensor image in FIG. 8(a) looks the same like that shown in FIG. 5 and FIG. 7(a), except that the effect of positioning inaccuracy has placed the individual grating images 42(−) to 45(−) at positions P1' to P4' which are not quite the same as the 'ideal' positions P1 to P4. FIG. 7(b) looks similar but with different intensities of the grating images 42(+) to 45(+). Note that the overall arrangement of the gratings in the image field has not changed, in contrast with FIG. 7(b). However, the positions P1" to P4" of the individual grating images are potentially different again from the positions P1' to P4'. In the case where the two images are taken by swapping the illumination mode without moving the substrate, positions P1' and P1" are likely to be the same. In general, however, they may be different, as shown.

Also shown in FIG. 8 is the indexing of pixel position in the sensor 23 image field. For the sake of example, index i represents the pixel position in a horizontal direction, while j represents the pixel position in a vertical direction. These directions may conveniently correspond to the X and Y directions on the substrate, but this is not necessarily so.

If either or both of the illumination spot and the imaging performance of the scatterometer are somehow different between the illumination modes used in step S2 and S3, then the differences calculated in step S4 will not represent purely the asymmetry of the target. Such differences in performance can arise at the illumination side, where the aperture plates 13N, 13S (or other means for delivering the desired illumination distribution) are not exactly symmetrical. There may also be asymmetry in the optical components such as lenses and field stop 21, or in sensor 23 itself. Such asymmetry can arise not only by manufacturing tolerances, but also after manufacture, by contamination or damage of optical surfaces.

Similarly, the illumination source 11 may be such that the intensity and/or phase of illumination spot 31 is not uniform. Therefore, even for the same grating and illumination/imaging mode, a different intensity will be measured at each position P1 to P4, reducing the accuracy of the asymmetry measured. In a prior patent application U.S. application Ser. No. 12/855,394, which is incorporated by reference herein in its entirety, separate calibration curves are used in step S4 to derive asymmetry/overlay from the difference image, the appropriate curve being selected according to position at which the measurements were made. Part of the incentive to use the image sensor 23 is to reduce requirements for accurate positioning, as already mentioned. Curves cannot necessarily be derived and stored for every possible permutation of positions P1'& P1", P2'& P2" etc.

To address these error sources and to provide a more accurate measurement method with potentially higher throughput, the present inventors propose a variety of correction schemes that include corrections for (i) the use of different light paths to obtain both $-1^{st}$ and $+1^{st}$ diffraction orders, instead of rotation of the wafer and (ii) the spot profile variations of the intensity in the illumination spot. Each of these corrections will potentially also 'mop up' minor contributions from other sources, such as contamination or damage, provided those sources are present at the time of calibration. If one of these corrections is not necessary to achieve the desired performance, then it can be omitted without departing from the scope of Embodiments of the present invention.

With these corrections, throughput can be increased by using oppositely incident light instead of the time consuming wafer rotation plus necessary alignment steps. Furthermore, throughput is increased by simultaneous measurement of several gratings within one target, which consequently are spatially separated. They will therefore be positioned at different positions within the spot. Moreover, the sensitivity of the measurement to exact positioning of the target within the illumination spot is reduced by the proposed corrections, as well as the sensitivity for artifacts at the camera like dirt at an equivalent wafer plane. Three example implementations will be described. In the first and second implementations, the proposed correction scheme is applied to the region-of-interest (ROI) of the gratings as a whole. In the second implementation, the correction is applied pixel-by-pixel for the whole illumination spot.

It would also be a problem if the illumination spot were not consistently positioned within the image field, but in practice that source of error can be eliminated by good design.

Before describing specific implementations, FIG. 9 shows the general principles of a modification of the FIG. 6 process, which accommodates a correction scheme in accordance with the present invention. In a new step S0, calibration measurements are performed to collect data on the asymmetries and position variations present between modes. Basically, intensity measurements are made in each illumination mode using identical targets and target positions, to identify the intensity difference which is attributable to the change of illumination. Separately, measurement of the same target can be made at different positions, without changing the illumination mode. These sets of measurements can be performed in combination. An example will be described later with reference to FIGS. 10 & 11.

Following the measurement in step S2 and prior to the calculation of intensity difference in step S4, a correction is applied at S2a to remove characteristics of the first illumination mode that have been determined in step S0. A second correction is applied at S2b to remove the influence of the particular position in the image field where the grating in question is found (FIG. 7(a) or 8(a)). Following the measurement in step 3 and prior to the calculation of intensity difference in step S4, a correction is applied at S3a to remove characteristics of the second illumination mode that have been determined in step S0. A second correction is applied at S3b to remove the influence of the particular position in the image field where the grating in question is found in the second image (FIG. 7(b) or 8(b)). It will be noted that in the embodiments described herein, the calibration and correction are performed in the domain of measured intensities, prior to or as part of measuring the intensity difference in step S4. This is different to schemes which would apply a correction in the later stage of deriving overlay results from the intensity difference. In principle, it would be possible to use one of the illumination modes as the 'baseline' reference for correction of the other. Then, in principle, step S2a or S3a could be omitted. Similarly, if one of the positions were adopted as the reference position, one of the steps S2b or S3b could be omitted. In practice, however, it is likely that each intensity measurement will be corrected with reference to a common reference. This is particularly desirable when both position correction and mode correction are to be implemented, because the two sources of asymmetry become coupled together and to choose one particular mode and position as a reference would be artificial and inconvenient. Since an absolute performance reference is not likely to be available, the embodiments described below choose to use the average performance of a pair or set of measurements to serve as the baseline for the correction of each individual measurement in the set. Since all the measurements are concerned with relative intensity values, it does not matter that there is no absolute reference.

Correction Implementation 1:

In a first implementation, an illumination mode correction (steps S2a and S3a) corrects for the case that diametrically opposed illumination apertures are used for the overlay measurement (leading to tool-induced-shift (TIS) in the intensities). A spot profile correction (steps S2b and S3b) corrects for the case of two or more gratings within one target, of which the images are recorded in a single shot. For this case the gratings have necessarily not the same position within the illumination spot, and the illumination spot profile (and other factors) will influence their intensities. Note that the spot profile correction of steps S2b and S3b can be applied even in embodiments where the substrate is rotated without changing the illumination mode, and the single measured grating is positioned exactly at the same position within the spot each time; then steps S2a and S3a are unnecessary. However, the availability of the illumination mode correction opens the possibility to enhance throughput by measuring only at 0° wafer rotation.

The skilled person will appreciate that the calibrations and measurements in a real application will normally be duplicated for the different orientations of grating, and possibly for different types of grating also. References to 'left' and 'right' in this section can be interpreted as either 'north' and 'south' or 'east' and 'west' (in the terminology of the above description), according to the orientation of the grating being measured.

In the first implementation, where there are only two possible positions for each grating and only two illumination modes, three correction parameters are introduced: one for the illumination asymmetry for incident light from left and right, one for the spot profile dependence, and one to describe their interdependence. The following notation is taken: $\delta$ describes the average asymmetry between first and second illumination modes, $\Delta\delta$ indicates the deviation from this average asymmetry between first and second positions of a grafting, and $\epsilon$ describes the difference between the average illuminations at the different positions.

The skilled reader will appreciate that different definitions of correction parameters could be chosen, and the calculations adapted accordingly. More general examples will be shown in the second and third implementations described below. In an embodiment where the same position is always assured, only the first parameter would be required. Naturally, in embodiments where the illumination is constant and the field stop or equivalent is changed to change the imaging mode, the first parameter is adapted to describe asymmetry between imaging modes, rather than illumination modes.

In the equations and diagrams that follow, subscripts QL and QR will be used to refer to measurements made under the left and right illumination modes, respectively. In this first implementation, calibration and correction is done assuming that the grating images will occupy one of two known positions within the image field. Subscripts 1 and 2 will be used to refer to two different grating positions within the spot, for example positions P1 and P2 of the images in FIGS. 5, 7 and 8, which do not rotate with wafer rotation. The superscripts 0 and $\pi$ refer to the substrate orientation of 0° and 180°, respectively. (Even if the substrate is not rotated in the measurement process, a calibration substrate will be rotated for the purposes of calibration.) The intensities with tilde $\tilde{I}_{+1}$ and $\tilde{I}_{-1}$ refer to the ideal +1 and −1 diffraction order intensities from the grating. The grating doesn't have to be symmetric: $\tilde{I}_{+1}$ and $\tilde{I}_{-1}$, for a biased grating (or a grating with overlay error) will differ.

To be able to determine the correction parameters $\delta$, $\Delta\delta$ and $\epsilon$, a calibration measurement (step S0) needs to be performed accurately. Real measurements on a single grating can be made at different positions, orientations, and illumination modes. The skilled reader will appreciate how to extend the calibration and correction parameters to other situations, for example where more than two positions are possible. Using the notation introduced above, this single grating then yields the eight measured intensities:

$$I_{QL,1}{}^0=(1-(\delta+\Delta\delta))(1-\epsilon)\tilde{I}_{+1} \quad I_{QL,1}{}^\pi=(1-(\delta+\Delta\delta))(1-\epsilon)\tilde{I}_{-1}$$

$$I_{QR,1}{}^0=(1+(\delta+\Delta\delta))(1-\epsilon)\tilde{I}_{-1} \quad I_{QR,1}{}^\pi=(1+(\delta+\Delta\delta))(1-\epsilon)\tilde{I}_{+1}$$

and $$I_{QL,2}{}^0=(1-(\delta-\Delta\delta))(1+\epsilon)\tilde{I}_{+1} \quad I_{QL,2}{}^\pi=(1-(\delta-\Delta\delta))(1+\epsilon)\tilde{I}_{-1}$$

$$I_{QR,2}{}^0=(1+(\delta-\Delta\delta))(1+\epsilon)\tilde{I}_{-1} \quad I_{QR,2}{}^\pi=(1+(\delta-\Delta\delta))(1+\epsilon)\tilde{I}_{+1}$$

Solving for $\delta$, $\Delta\delta$ and $\epsilon$ yields:

$$\delta = \frac{1}{4}\left\{\frac{I^\pi_{QR,1}-I^0_{QL,1}}{I^\pi_{QR,1}+I^0_{QL,1}} + \frac{I^\pi_{QR,2}-I^0_{QL,2}}{I^\pi_{QR,2}+I^0_{QL,2}} + \frac{I^0_{QR,1}-I^\pi_{QL,1}}{I^0_{QR,1}+I^\pi_{QL,1}} + \frac{I^0_{QR,2}-I^\pi_{QL,2}}{I^0_{QR,2}+I^\pi_{QL,2}}\right\} \text{ and}$$

$$\Delta\delta = \frac{1}{4}\left\{\frac{I^\pi_{QR,1}-I^0_{QL,1}}{I^\pi_{QR,1}+I^0_{QL,1}} - \frac{I^\pi_{QR,2}-I^0_{QL,2}}{I^\pi_{QR,2}+I^0_{QL,2}} + \frac{I^0_{QR,1}-I^\pi_{QL,1}}{I^0_{QR,1}+I^\pi_{QL,1}} - \frac{I^0_{QR,2}-I^\pi_{QL,2}}{I^0_{QR,2}+I^\pi_{QL,2}}\right\} \text{ and}$$

$$\epsilon = \frac{(I^\pi_{QR,2}+I^0_{QL,2})-(I^\pi_{QR,1}+I^0_{QL,1})+(I^0_{QR,2}+I^\pi_{QL,2})-(I^0_{QR,1}+I^\pi_{QL,1})}{(I^\pi_{QR,2}+I^0_{QL,2})+(I^\pi_{QR,1}+I^0_{QL,1})+(I^0_{QR,2}+I^\pi_{QL,2})+(I^0_{QR,1}+I^\pi_{QL,1})}$$

FIG. 10 illustrates a grating target that will be used as an example to illustrate a calibration process. The target in this example comprises a pair of gratings T(−d) and T(+d) which are shown side by side in plan view FIG. 10 (a) and in a composite cross-section in FIG. 10(b). The suffix −d and +d in this case indicates an overlay bias between two superimposed sets of grating lines. The individual gratings are elongated in the direction of periodicity (in this drawing, the X direction). Compared with the square shaped gratings shown earlier, this elongate form allows a stronger diffraction signal to be maintained as the area occupied by the grating is reduced to save space on the substrate.

The elongate form of grating is the subject of a separate patent application (reference P-3719, not published at the present priority date), which is incorporated herein by reference in its entirety. The spot size will of course vary according to the instrument. It may have a diameter up to 100 μm, for example, or less than 50 μm, or less than 30 μm. Individual grating portions may have a length (perpendicular to their grating lines) which is less than 15 μm, or less than 10 μm. A composite target comprising at least four gratings may for example be contained in a circle of diameter less than 50 μm or less than 30 μm. A composite target comprising at least four gratings may for example occupy a rectangular area on the substrate which is less than 200 μm$^2$, or less than 150 μm$^2$. Within such a composite target, the individual grating portions may each for example have a length greater than 6 μm and a width less than 6 μm. In this way, targets can be made small enough to be located within device areas on the substrate, as well as in scribe lanes.

The layer stack in which the calibration target T is formed should be identical as far as possible to the stack in which the targets from which overlay is to be measured. Otherwise, the diffraction signals will be influenced by process variables other than overlay, and the overlay measurement accuracy will be reduced in consequence. These other process variables include for example the layer thicknesses of the component gratings, CD and side wall angles. To achieve a desired level of accuracy, it may therefore be necessary to perform the calibration process using target gratings on the actual substrate to be measured, or at least on a representative substrate of the same batch or lot. The calibration process will be time consuming as a result, but there will be a throughput saving overall, when the calibration enables quicker measurements to be performed on a number of targets on the same substrate or batch of substrates.

FIG. 11 illustrates the calibration process of the first implementation. Six measurement steps M1-M6 are performed on the target of FIG. 10, in which the intensity of one or both of the gratings (−d and +d) is measured under each of the illumination modes (QL, QR). Each grating may be located at one of two positions separated in the Y direction, labeled PY=1 and PY=2. Both of these positions fit within the illumination spot simultaneously. The legend RZ indicates the rotation of the target, either 0 or $\pi$ (180°). The next row in the diagram illustrates schematically the Y position of each grating. The table at 1100 illustrates the intensities measured in each step M1 etc. for each grating T(−d) and T(+d). Now that two gratings have been measured, the correction parameters can be calculated using the equations given above. Since both gratings have been measured in all eight permutations of illumination, rotation and position, their results can be combined (averaged) to calculate the correction parameters with greater accuracy. Of course more gratings, and/or repeated measurements of the same gratings, can be used to improve statistical accuracy still further. In principle, it would be sufficient for the calibration to measure one of the gratings at one target position for 0° and 180°, plus one at 0° and one at 180° at the two different positions, yielding a calibration scheme for the positive or negative bias only. It is simpler, and gives more accurate results for little more effort, to measure at three target positions for 0° and 180°. FIG. 11 illustrates this expanded set of measurements.

Step S0 is then complete, and measurement of asymmetry in real target gratings can then continue by repeated application of steps S1-S5, using the correction parameters automatically to eliminate or reduce machine- and position-dependent errors in the intensity difference of step S4. For example, the corrected intensity for a grating measured upright, with left illumination and at position PY=2 would be obtained by inverting the third equation in the left hand column above, i.e.:

$$\tilde{I}_{+1} = I_{QL,2}{}^0/((1-(\delta-\Delta\delta))(1+\epsilon))$$

This single calculation combines the correction steps S2*a* and S2*b* (or S3*a* and S3*b*) in the process of FIG. 9.

Note that the grating rectangle represents a region of interest (ROI). As the ROI covers a number of pixels in the sensor 23 image field, each intensity measurement in the calibration process, as well as in the actual measurement process is an integral or average of the individual pixel intensities covered. The ROI may be trimmed smaller than the full grating image, for example to eliminate edge effects, if desired. Wnere the ROI is smaller than the grating, it can also be trimmed to match more closely the designated position, and eliminate position-dependent inaccuracy in the measurements. Provided the same trimming is performed in the calibration steps as in the actual measurements, the accuracy of the results will not be affected, and may be enhanced.

Correction Implementation 2:

Referring to FIGS. 8, 9 and 12, a second implementation of the correction scheme will be described. The same principles and notations can be applied (or variations of them that can be envisaged by the skilled reader). In this second implementation, instead of considering the corrections for the grating at only certain allowed positions, correction parameters are defined and stored for any possible position of the target grating within the illumination spot as imaged on the sensor 23. The pixels and the illumination spot position are considered to be fixed in relation to the optical system of the scatterometer. (The calibration and correction methods can be adapted still further if either of these assumptions is not true in a particular embodiment.)

Referring back to FIG. 8, it is recalled that the grating positions may not coincide with predetermined positions such as those labeled P1-P4, but may lie at variable positions such as P1' or P1". These variations in position may arise because the positioning system of the substrate is incapable of positioning the target more accurately, or because the operator does not want to incur a throughput penalty by allowing sufficient time for the target to be positioned more accurately. An advantage of this second implementation is that possible positioning errors of the grating can be detected, and the corrections can be applied according to the exact (pixel) position of the grating image. Also, this may correct for artifacts such as contamination or degradation that is locally present on the camera or at an equivalent wafer plane. In practice, as already mentioned, the calibration step S0 will be repeated after a period of operation, so as to correct for additional contamination.

In this implementation, maps of the correction parameters δ and ε are made using a calibration measurement. The two fixed positions PY=1 and PY=2 in the first implementation, are then replaced by a finely variable position P(i,j) of the region of interest ROI defined by an individual grating image. Note that, in this implementation as in the first implementation, the size and shape of the ROI does not change. The indices (i,j) that identify position P(i,j) can be defined by reference for example to the top left corner of the ROI, or its centre. After the calibration measurements have been made, the 'ideal' intensity value $\tilde{I}$ is obtained by averaging calibration measurements made over left-right illumination, 0° and 180° degrees target rotation, as well as over all possible positions within the spot. This yields then maps of correction parameters δ=δ(ij), and ε=ε(i,j) that describe the deviation from the ideal (average) value for each situation and for each position P(i,j), P'(i,j) etc.

As will be appreciated, these maps are stored separately for each of the different illumination modes (or imaging modes, if appropriate). In practice, separate maps of correction parameters may also be stored for additional wavelengths of radiation that may be used, and for different polarizations of radiation. If a 'best' wavelength is identified and used exclusively, the number of maps and the number of calibration measurements can be reduced. Similarly, if the polarization known to remain constant, the number of calibration measurement and correction parameters can be reduced.

Correction Implementation 3:

Referring to FIGS. 8, 9 and 13, a third implementation of the correction scheme will be described. The same principles and notations can be applied (or variations of them that can be envisaged by the skilled reader). In this second implementation, instead of considering the corrections for the grating and its position as a whole, alternatively, the correction scheme is applied for each pixel within the illumination spot as imaged on the sensor 23. The pixels and the illumination spot position are considered to be fixed in relation to the optical system of the scatterometer. (The calibration and correction methods can be adapted still further if either of these assumptions is not true in a particular embodiment.)

Referring back to FIG. 8, it is recalled that the grating positions may not coincide with predetermined positions such as those labeled P1-P4, but may lie at variable positions such as P1' or P1". These variations in position may arise because the positioning system of the substrate is incapable of positioning the target more accurately, or because the operator does not want to incur a throughput penalty by allowing sufficient time for the target to be positioned more accurately. An advantage of this second implementation is that possible positioning errors of the grating can be detected, and the corrections can be applied pixel-by-pixel. Also, processing pixel-by-pixel this may correct for artifacts such as contamination or degradation that is locally present on the camera or at an equivalent wafer plane. In practice, as already mentioned, the calibration step S0 will be repeated after a period of operation, so as to correct for additional contamination.

In this implementation, maps of the correction parameters δ and ε are made using a calibration measurement. The positions PY=1 and PY=2 in the first implementation, are then replaced by position P(i,j) of pixel (i,j). The ideal value obtained by averaging over left-right illumination, 0° and 180° degrees target rotation, as well as over all pixels within the spot. This yields then the maps of δ=δ(i,j), and ε=ε(i,j) that describe the deviation from the ideal (average) value.

As will be appreciated, these maps are stored separately for each of the different illumination modes (or imaging modes, if appropriate). In practice, separate maps of correction parameters may also be stored for additional wavelengths of radiation that may be used, and for different polarizations of radiation. If a 'best' wavelength is identified used exclusively, the number of maps and the number of calibration measurements can be reduced. Similarly, if the polarization known to remain constant, the number of calibration measurement and correction parameters can be reduced.

In one embodiment of this type, the calibration procedure (step S0) consists of the accurate measurement of one large grating that fits well within the illumination spot and which doesn't contain variations of the structure over the grating (for example, no process effects so that there should be no variation in diffraction efficiency over pixels (i,j)). The calibration target can be for example a 40×40 µm2 grating that has similar gratings properties (the same stack) as the small in-die targets that need to be measured. The measurements need to be performed for left- and right-incident light, and for both 0° and 180° degrees wafer rotation, for the calibration in the x-direction. Similar for the y-direction.

For this calibration step, the target may be biased. Therefore one can use for example the X1 and Y1 gratings of a standard 40×160 µm2 overlay target that is positioned in the scribe lane. A special calibration target is not therefore required, but a large target with properties that a similar to the small targets needs to be available.

In the illustration of FIG. 13, we see schematically how measured pixel intensity values I(i,j) are corrected to 'ideal' values Ĩ(i,j), using pixel correction parameters δ(i,j) and ε(i,j), that have been stored in association with the pixels of the image field. When it comes to apply correction in the steps S2a/S2b or S3a/S3b, the pixel correction parameters for each the pixels falling within the region of interest (ROI) are then retrieved and applied to the intensities measured at those pixels, before integrating (summation E) the pixel intensities over the ROI. Although the amount of data storage and calculation per ROI is much greater in this implementation than in the first implementation, it is able to maintain accuracy in the presence of variations of the ROI position of the type shown in FIG. 8. Another advantage of this third implementation is that the same map of correction parameters can be used to correct a measured image of arbitrary size and shape. FIG. 12 shows in broken outline a second region of interest labeled ROI', that can be imaged and corrected using the same pixel correction parameters. Compared with the second implementation, calibration may be faster using the single large grating. However, there may be a disadvantage in that the calibration measurements are not performed using gratings identical to those that will pertain during the subsequent measurements. For example, it can be appreciated that the intensities recorded during the calibration process in the second implementation will include edge effects and inter-pixel effects caused by partial coherence of the radiation which will more closely replicate those occurring in the subsequent measurement steps. To save processing and/or storage space, it would be possible to store the correction parameters at a lower resolution than the image. Correction parameters might then be applied to blocks of pixels of the measured image, or interpolated. Correction accuracy may be reduced, because of mismatch between the ROI edges and the block edges, and due to high spatial frequency effects (e.g., dirt on a single camera pixel), but this may be tolerable in the interest of storage or computational burden. The ROI may be trimmed to the block boundaries, if the grating is larger than the ROI required for accurate asymmetry measurement. A hybrid of the first and second implementations might be adopted, in which correction parameters are pre-stored for a number of ROI positions (like the first implementation), but then the correction parameters applied to a measured ROI are interpolated between two or more of the correction ROIs, according to the overlap or proximity of their areas.

The corrections taught above enable one or more of the following benefits. Enhanced throughput possible of the DF-overlay measurement while maintaining the correctness of the measured overlay value. This is achieved by using opposite illumination angles instead of substrate rotation, and/or by simultaneous readout of two or gratings at different positions within the illumination spot. Reduction of dependence of the measured overlay on positional accuracy in the illumination spot. Reduction of the dependence on the incident illumination angle for the DF-overlay. Reduction of the effects of artifacts due to for example dirt in a wafer equivalent plane. Potential to correct for aberration dependencies, partial coherence and neighboring structures, in combination with the grating position (implementations 1 and 2).

While specific embodiments of the present invention have been described above, it will be appreciated that Embodiments of the present invention may be practiced otherwise than as described. The examples above feature multiple measurements using dark field imaging techniques, where the zero order diffracted radiation is excluded from the optical path to the image sensor 23. The techniques described above can also be used to apply corrections in other types of measurement. For example, in other techniques, intensity measurements from targets may be made using zero order radiation to form an image. Where the target is smaller than an illumination spot and the image of a target component is smaller than a field of view of the measurement optical system, several intensity measurements can be performed in a single step by arranging several target components in a composite target, forming an image using the desired radiation, and separating the measurement results by detecting the intensity in different parts of the image sensed by the sensor. Since each target component in that case is then measured through a different optical path, the measurements will include a position-dependent error, in addition to the wanted variations that represent process parameters to be measured.

The techniques described above can be performed to calibrate and then correct the intensity measurements, according to the position of the individual components of the image. Each target component can be measured at each of a fixed set of possible locations as part of the calibration process, similar to the first implementation described above. The calibration process can be performed for freely variable positions, similar to the second implementation, described above with reference to FIG. 12. The calibration process can be performed for individual pixels of the image field, so as to allow the region of interest to be freely defined in the manner of the third implementation described above with reference to FIG. 13. If the measurement process uses different wavelengths and/or polarizations of radiation, then calibration can be performed for these separately. On the other hand, these zero-order embodiments will not feature the different illumination modes and so the correction parameter 6 may be redundant.

While the target structures described above are metrology targets specifically designed and formed for the purposes of measurement, in other embodiments, properties may be measured on targets which are functional parts of devices formed on the substrate. Many devices have regular, grating-like structures. The terms 'target grating' and 'target structure' as used herein do not require that the structure has been provided specifically for the measurement being performed.

In association with the physical grating structures of the targets as realized on substrates and patterning devices, an embodiment may include a computer program containing one or more sequences of machine-readable instructions describing a methods of producing targets on a substrate, measuring targets on a substrate and/or analyzing measurements to obtain information about a lithographic process. This computer program may be executed for example within unit PU in the apparatus of FIG. 3 and/or the control unit LACU of FIG. 2. There may also be provided a data storage medium (e.g., semiconductor memory, magnetic or optical disk) having such a computer program stored therein.

Although specific reference may have been made above to the use of embodiments of the present invention in the context of optical lithography, it will be appreciated that embodiments of the present invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g., having a wavelength of or about 365, 355, 248, 193, 157 or 126 nm) and extreme ultra-violet (EUV) radiation (e.g., having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

The foregoing description of the specific embodiments will so fully reveal the general nature of embodiments of the present invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description by example, and not of limitation, such that the terminology or phraseology of the present specification is to be interpreted by the skilled artisan in light of the teachings and guidance.

It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

The present invention has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of embodiments of the present invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

The invention claimed is:

1. A method of measuring asymmetry in a periodic structure formed by a lithographic process on a substrate, the method comprising:
   using the lithographic process to form a periodic structure on the substrate;
   a first measurement step comprising forming and detecting a first image of the periodic structure while illuminating the structure with a first beam of radiation, the first image being formed using a first part of non-zero order diffracted radiation while excluding zero order diffracted radiation;
   a second measurement step comprising forming and detecting a second image of the periodic structure while illuminating the structure with a second beam of radiation, the second image being formed using a second part of the non-zero order diffracted radiation which is symmetrically opposite to the first part, in a diffraction spectrum of the periodic structure; and
   using a difference in intensity values derived from the detected first and second images together to determine the asymmetry in the profile of the periodic structure,
   wherein the first and second measurement steps are performed using different optical paths within a measurement optical system, and
   at least one correction, applied either to the first and second image intensity values or to the calculated difference between them, for reducing an influence on the determined asymmetry of the difference in optical paths between the first and second measurement steps.

2. The method of claim 1, wherein:
   at least one correction parameter is defined with predetermined values associated with different available optical paths, and
   the correction comprises selecting a value for the correction parameter according to the optical path used in one or both of the measurement steps and applying the correction parameter to the intensity values derived from the image obtained in that measurement step.

3. The method of claim 1, wherein:
   the first and second measurement steps are performed using respectively a first and a second illumination mode of the measurement optical system, such that the first and second beams of radiation are incident on the periodic structure from symmetrically opposed angles relative to an optical axis of the measurement optical system, without rotating the substrate relative to the measurement optical system, and at least one correction parameter is defined to compensate for asymmetry between optical paths defining the first and second illumination modes.

4. The method of claim 1, wherein the first and second measurement steps are performed using respectively a first and a second imaging mode of the measurement optical system such that the first and second images are formed using portions of radiation diffracted by the periodic structure to diametrically opposed angles relative to an optical axis of the measurement optical system, without rotating the substrate relative to the measurement optical system, and at least one correction parameter is defined to compensate for asymmetry between optical paths defining the first and second imaging modes.

5. The method of claim 1, further comprising calibration wherein values for the correction parameter are at least partially determined using the results of a plurality of calibration measurements performed on a substrate which is rotated and measured without changing the optical path.

6. The method of claim 1, wherein the correction parameter value is selected based at least in part on the position of the periodic structure within a field of view of the measurement optical system.

7. The method of claim 6 wherein:
the field of view is defined by an illumination spot of the respective radiation beam,
the periodic structure occupies less than half the area of the field of view such that a plurality of periodic structures can be imaged simultaneously within the image field, and
a value for the correction parameter is defined for a set of two or more alternative positions within the field of view at which a periodic structure may be imaged.

8. The method of claim 1, wherein separate correction parameters are defined for correcting (a) an asymmetry in intensity between illumination or imaging modes used in the first and second measurement steps and (b) a variation in illumination intensity across a field of view of the measurement optical system.

9. The method of claim 8, wherein the correction parameter (a) is further dependent or a position of the periodic structure within the field of view of the measurement optical system.

10. An inspection apparatus configured for measuring asymmetry in a periodic structure on a substrate, the inspection apparatus comprising:
an illumination arrangement operable to deliver first and second beams of radiation to the substrate for use in first and second measurements;
a detection arrangement operable during the first and second measurements to form and detect respective first and second images of the substrate using radiation diffracted from the substrate; and
a stop arrangement within the detection arrangement,
wherein the illumination arrangement and stop arrangement together are effective to stop zero order diffracted radiation contributing to the first and second images, and are configurable to form first and second images using first and second parts respectively of the non-zero order diffracted radiation, the first and second parts being symmetrically opposite one another in a diffraction spectrum of the diffracted radiation,
a computational arrangement operable to determine the asymmetry using a difference in intensity values derived from the first and second images, the computational arrangement is operable when calculating the difference to apply a correction for reducing an influence on the determined asymmetry of a difference between first and second optical paths, that are used within the inspection apparatus for the first and second measurements respectively.

11. The inspection apparatus of claim 10, wherein the inspection apparatus is further operable to perform a plurality of calibration measurements on a substrate which is rotated and measured without changing the optical path, and wherein the computational arrangement is further operable to determine, from results of the calibration measurements, values for the correction parameter.

12. The inspection apparatus of claim 10, wherein:
the detection arrangement is operable to image a plurality of periodic structures simultaneously within the image field, and
the computational arrangement is further operable to define a value for the correction for a set of two or more alternative positions within the field of view at which a periodic structure may be imaged.

13. A lithographic system comprising:
a lithographic apparatus comprising:
an illumination optical system arranged to illuminate a pattern;
a projection optical system arranged to project an image of the pattern onto a substrate; and
an inspection apparatus comprising,
an illumination arrangement operable to deliver first and second beams of radiation to the substrate for use in first and second measurements;
a detection arrangement operable during the first and second measurements to form and detect respective first and second images of the substrate using radiation diffracted from the substrate; and
a stop arrangement within the detection arrangement,
wherein the illumination arrangement and stop arrangement together are effective to stop zero order diffracted radiation contributing to the first and second images, and are configurable to form first and second images using first and second parts respectively of the non-zero order diffracted radiation, the first and second parts being symmetrically opposite one another in a diffraction spectrum of the diffracted radiation,
a computational arrangement operable to determine the asymmetry using a difference in intensity values derived from the first and second images, the computational arrangement is operable when calculating the difference to apply a correction for reducing an influence on the determined asymmetry of a difference between first and second optical paths, that are used within the inspection apparatus for the first and second measurements respectively,
wherein the lithographic apparatus is arranged to use the measurement results from the inspection apparatus in applying the pattern to further substrates.

14. A method of manufacturing devices wherein a device pattern is applied to a series of substrates using a lithographic process, the method including:
inspecting at least one periodic structure formed as part of or beside the device pattern on at least one of the substrates using an inspection method comprising,
using the lithographic process to form a periodic structure on the substrate;
a first measurement step comprising forming and detecting a first image of the periodic structure while illuminating the structure with a first beam of radiation, the first image being formed using a first part of non-zero order diffracted radiation while excluding zero order diffracted radiation;

a second measurement step comprising forming and detecting a second image of the periodic structure while illuminating the structure with a second beam of radiation, the second image being formed using a second part of the non-zero order diffracted radiation which is symmetrically opposite to the first part, in a diffraction spectrum of the periodic structure; and using a difference in intensity values derived from the detected first and second images together to determine the asymmetry in the profile of the periodic structure, wherein the first and second measurement steps are performed using different optical paths within a measurement optical system, and at least one correction, applied either to the first and second image intensity values or to the calculated difference between them, for reducing an influence on the determined asymmetry of the difference in optical paths between the first and second measurement steps, and controlling the lithographic process for later substrates in accordance with the result of the inspection method.

\* \* \* \* \*

UNITED STATES PATENT AND TRADEMARK OFFICE
CERTIFICATE OF CORRECTION

PATENT NO. : 8,867,020 B2
APPLICATION NO. : 13/235902
DATED : October 21, 2014
INVENTOR(S) : Smilde et al.

It is certified that error appears in the above-identified patent and that said Letters Patent is hereby corrected as shown below:

Claims

Column 25, line 41, Claim 9, after "dependent" please delete "or" and insert --on--.

Signed and Sealed this
Nineteenth Day of May, 2015

Michelle K. Lee
*Director of the United States Patent and Trademark Office*